United States Patent
Van Rijckevorsel et al.

(10) Patent No.: US 6,664,134 B2
(45) Date of Patent: Dec. 16, 2003

(54) METHOD OF MOUNTING A SEMICONDUCTOR DEVICE WITH A EUTECTIC LAYER

(75) Inventors: Johannes Wilhelmus Van Rijckevorsel, Nijmegen (NL); Eugene Adriaan Vriezen, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 17 days.

(21) Appl. No.: 10/082,028

(22) Filed: Feb. 21, 2002

(65) Prior Publication Data

US 2002/0123223 A1 Sep. 5, 2002

(30) Foreign Application Priority Data

Feb. 23, 2001 (EP) .............................. 01200665

(51) Int. Cl.⁷ ............................................... H01L 21/44
(52) U.S. Cl. ...................................... 438/119; 438/118
(58) Field of Search ................................ 438/118, 119

(56) References Cited

U.S. PATENT DOCUMENTS

| | | | |
|---|---|---|---|
| 4,487,638 A | 12/1984 | Hoge | 148/24 |
| 5,038,196 A | 8/1991 | Fukushima | 357/73 |
| 5,296,074 A * | 3/1994 | Graham et al. | 156/309.9 |
| 6,462,413 B1 * | 10/2002 | Polese et al. | 257/732 |

FOREIGN PATENT DOCUMENTS

| | | | |
|---|---|---|---|
| JP | A341742 | 2/1991 | H01L/21/52 |
| JP | 11-150213 | * 6/1999 | |

OTHER PUBLICATIONS

Patent Abstracts of Japan, vol. 008, No. 279 (C–257), Dec. 20, 1984, JP 59149956 A.
Patent Abstracts of Japan, Vol 015,No. 476 (E–1140), Dec. 4, 1991, JP 03206628A.
Patent Abstracts of Japan, vol. 015, No. 179 (E–1064), May 8, 1991, JP 03041742A.

* cited by examiner

*Primary Examiner*—Richard Elms
*Assistant Examiner*—Christian D. Wilson
(74) *Attorney, Agent, or Firm*—Steven R. Biren

(57) ABSTRACT

A method of manufacturing a semiconductor device (10) including a semiconductor element (1), such as a transistor, which is provided, on the rear side, with a conductive layer (3) including gold, and which is attached, on said side, to a conductive plate (2), such as a lead frame (2), by way of a silver-containing organic matrix (4) which is thermally cured. Subsequently, the element (1) is connected to the plate (2) by way of wire connectors (5) and provided with an encapsulation (6).

The silver paste (4) is cured at a temperature of at least 350° C., preferably approximately 400° C. In this way, an excellent adhesion of the element (1) to the plate (2) is obtained, enabling the wired connectors (5) to be subsequently provided by way of wire bonding without elements (1) becoming detached from the plate (2). Moreover, the connection is still sufficiently flexible to deal with a difference in thermal expansion between the element (1) and the plate (2), even if the latter is made of copper. The method is fast and very suitable for large-scale production of a reliable device (10). The gold used must be sufficiently mobile. Therefore, use is made of a low-melting gold layer including a eutectic composition of gold and antimony or preferably gold and germanium.

12 Claims, 1 Drawing Sheet

METHOD OF MOUNTING A SEMICONDUCTOR DEVICE WITH A EUTECTIC LAYER

BACKGROUND OF THE INVENTION

1. Field of the Invention

The invention relates to a method of manufacturing a semiconductor device comprising a semiconductor element that is situated on an electroconductive plate, wherein a side of the semiconductor element adjoining the electroconductive plate borders on an electroconductive layer containing Au (gold), and the semiconductor element is attached to the electroconductive plate by means of an Ag (silver)-containing organic matrix which is cured by means of a thermal treatment. Such a method is advantageously applied in the semiconductor industry, in particular in the manufacture of discrete semiconductor components. In said application, the conductive plate is in the form of, for example, an assembly of conductors in a so-termed lead frame. After the element has been attached to the plate, one or more electroconductive connections are made between (the upper side of) the semiconductor element and the conductive plate by means of wire bonding.

2. Description of the Related Art

Such a method is known from the abstract in the English language of a Japanese patent specification published under patent number JP A3 41742 on 22-2-1991. In said document, a description is given of the way in which a semiconductor element is provided, on a (lower) side, with an alloyed layer containing Au and Sb, after which it is glued, on this side, to a conductive plate by means of an Ag organic matrix. After curing the silver-containing organic matrix, wire connections are made between the element and the conductive plate. A thermal treatment which is customarily carried out to cure the silver-containing organic matrix normally takes place at a temperature in the range from 150 to 250° C. Finally, the device is provided with a synthetic resin envelope.

A drawback of the known method resides in that the adhesion of the semiconductor element to the conductive plate is sometimes found to be insufficient to resist the force(s) exerted on the connection during wire bonding, as a result of which the semiconductor element becomes detached. This applies, in particular, if the semiconductor element is comparatively small, for example if its dimensions are below approximately 400 μm. All this results in rejects, leading to an increase of the cost price. Instead of a conductive glued joint use can be made of a soldered joint. A soldered joint does not have the above-mentioned drawback, but it does have another drawback, namely that, in particular, an inexpensive and hence attractive, conductive plate of copper must first be provided with a silver layer to deal with stresses caused by the substantial difference between the coefficient of expansion of copper and that of the semiconductor element.

SUMMARY OF THE INVENTION

Therefore it is an object of the invention to provide a method which does not have the above-mentioned drawbacks, and which is inexpensive, straightforward and results in an excellent adhesion of the semiconductor element on the conductive plate, also if said plate is made of copper, without requiring the application of a silver layer on said conductive plate, and which also results in a very good wire bondability of the semiconductor element after it has been attached to the conductive plate.

To achieve this, in accordance with the invention, a method of the type mentioned in the opening paragraph is characterized in that said thermal treatment takes place at a temperature of at least 350° C. Surprisingly it has been found that a gold and (germanium or antimony)-containing layer of a eutectic composition on the semiconductor element results in a particularly strong and properly conducting connection between the semiconductor element and the conductive plate, provided that the silver-containing organic matrix is cured at the surprisingly high temperature of approximately at least 350° C. Excellent results have been achieved by subsequently providing the semiconductor element with wire connections to the conductive plate, i.e. the percentage of rejects in this process due to semiconductor elements becoming detached from the conductive plate is very low and much better than the percentage of rejects in the known method. This applies particularly to comparatively small semiconductor elements, such as discrete diodes or transistors, but also to small ICs. Further investigation has revealed that, in this method, the gold and, for example, the germanium that form a layer of melting eutectic penetrate into the silver-containing organic matrix by virtue of, inter alia, the comparatively high temperature treatment. Apparently, this causes the bonding effect of the (cured) silver-containing organic matrix to be improved, while the electric conductivity of the organic matrix remains satisfactory. Very surprisingly it has been found that, in spite of this improved adhesion and high-temperature curing, the organic matrix still remains sufficiently flexible to deal with a difference in thermal expansion between the semiconductor element and the conductive plate, if necessary. The use of eutectic AuSb or AuGe enables the gold and antimony or the gold and the germanium to penetrate to a substantial degree into the silver-containing organic matrix at the temperature used, which ranges, for example, between 350 and 400° C.

The best results are obtained if the thermal treatment takes place at a temperature of approximately 400° C. This temperature is clearly above the melting point of eutectics of, for example, gold and germanium or gold and antimony, which melt at a temperature of approximately 365° C. Connections formed at this temperature are found to be very robust during a subsequent wire bonding process step. The tensile strength at which the connection between the semiconductor element and the conductive plate is interrupted is approximately a factor of 2 higher than that of a connection formed at 350° C. At a substantially higher temperature, for example 450° C., the properties of the connection deteriorate and the organic components of the silver-containing organic matrix used partly decompose.

Optimum results are achieved if the Ag-containing organic matrix is provided on the semiconductor element via a conductive layer containing eutectic Au—Ge, after which the semiconductor element is pressed down on the electroconductive plate that has been heated to the temperature required for the thermal treatment. By virtue thereof, not only the above-mentioned favorable results are possible, but also the time necessary to form the connection is reduced to a minimum, which is very desirable for industrial-scale applications. The same applies to the use of copper as the material for the electroconductive plate. This material, whose coefficient of expansion differs comparatively substantially from that of the semiconductor element, is more attractive than, for example, an NiFe alloy having a low coefficient of thermal expansion, because said alloy is more expensive than copper and its thermal and electrical conductivity is worse than that of copper. For the silver-containing organic matrix used, use is preferably made of a multi-component mixture on the basis of an epoxy compound. This mixture can be cured in one or more steps. The use of germanium has the additional advantage that this element is less environmentally harmful than, for example, antimony.

Good results are achieved when the curing time is chosen to range between 5 and 50 msec, and preferably the curing time is chosen to be approximately 20 msec. Such a very short curing time enables a large-scale, inexpensive application of a method in accordance with the invention. For the electroconductive plate use is preferably made of a so-termed "lead-frame", i.e. an assembly of electrical conductors, and the semiconductor element is provided, after it has been attached to the electroconductive plate, with one or more wire connections with one or more conductors that form part of the plate. Subsequently, the semiconductor element, the wire connections and a part of the lead frame are provided with a protective synthetic resin envelope of, for example, an epoxy material.

The invention also comprises a semiconductor device obtained by means of a method in accordance with the invention, which semiconductor device exhibits favorable properties and is economically obtained in large numbers.

These and other aspects of the invention will be apparent from and elucidated with reference to the embodiments described hereinafter.

BRIEF DESCRIPTION OF THE DRAWINGS

In the drawings.

The Figures are not drawn to scale and, for clarity, particularly the dimensions in the thickness direction are exaggerated strongly. Wherever possible, corresponding areas or parts are indicated by means of the same reference numeral.

DETAILED DESCRIPTION OF THE INVENTION

Figure 1:
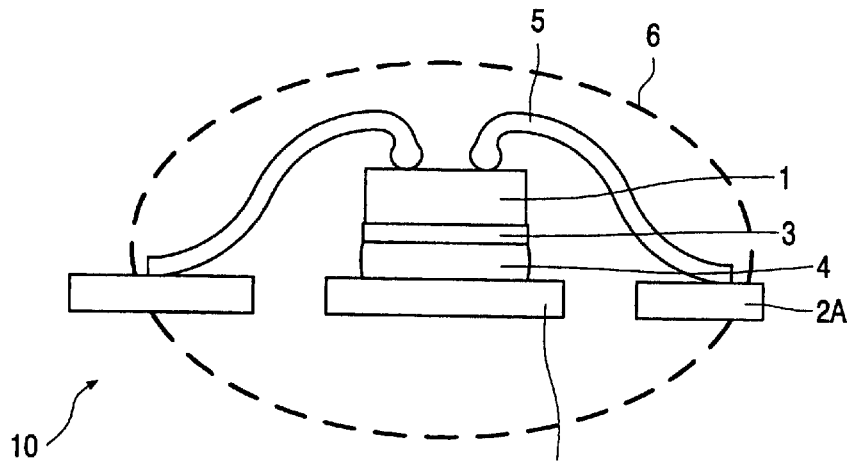
FIG. 1 is a diagrammatic, cross-sectional view, at right angles to the thickness direction, of a semiconductor device with a transistor manufactured by means of a method in accordance with the invention.

FIG. 1 is a diagrammatic, cross-sectional view, at right angles to the thickness direction, of a semiconductor device with a transistor manufactured by means of a method in accordance with the invention. The device 10 comprises a semiconductor element 1, in this case a transistor 1, which is provided at its lower side with an Au and Ge-containing layer 3. In this example, the conductive layer 3 includes a 100 nm thick Ti layer, a 300 nm thick Ni layer and a 1200 nm thick Au—Ge layer having a Ge content of 12% by weight. On the side of the conductive layer 3, the element 1 is attached, by means of a silver-containing organic matrix 4, to a conductive plate 2, in this case a copper lead-frame 2. Between the upper side of the element 1 and of conductors 2A forming part of the lead frame 2, one or more wire connections 5 are made, thereby providing connection areas, not shown in the Figure, of the element 1 with electrical connections 2A. The element 1, the wire connections 5 and a part of the lead-frame 2 are surrounded by a protective synthetic resin envelope 6 of an epoxy material. By virtue of a manufacturing method in accordance with the invention, which will be explained in greater detail hereinafter, the device 10 is very inexpensive, which can be attributed to the fact that the percentage of rejects during, in particular, the provision of the wire connections 5 is very low.

Figure 2A:
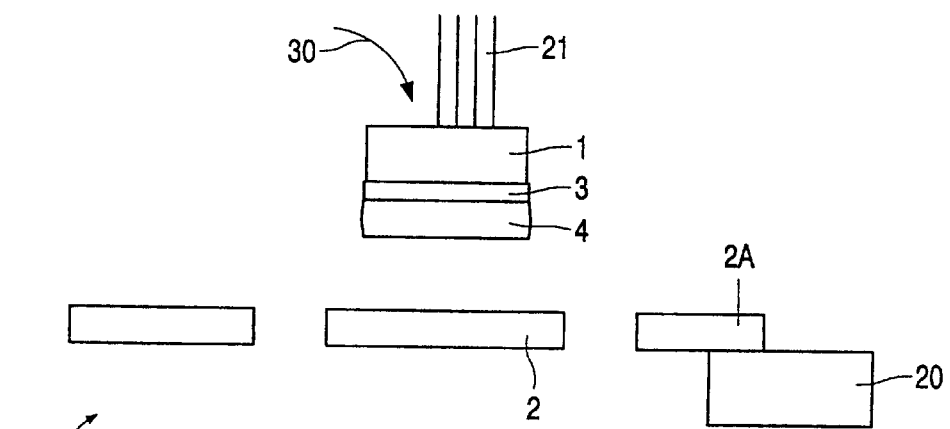
FIGS. 2A and 2B are diagrammatic, cross-sectional views, at right angles to the thickness direction, of the device shown in FIG. 1 in successive stages of the manufacturing process carried out by means of a method in accordance with the invention.
Figure 2B:
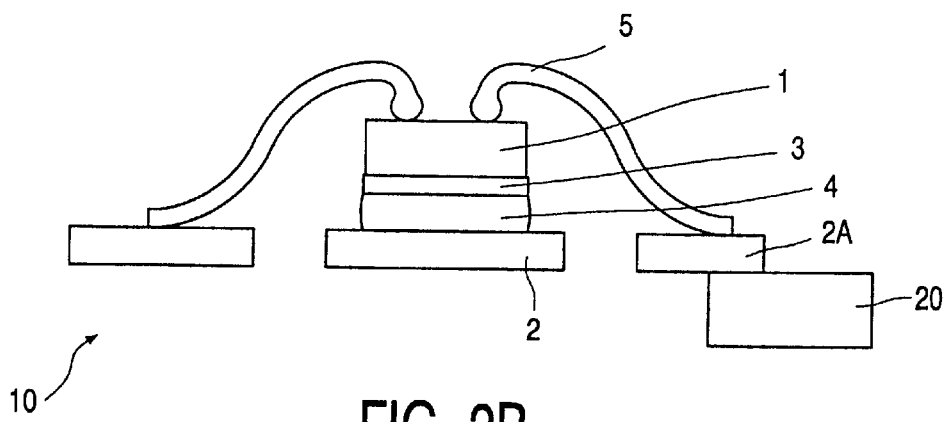

FIGS. 2A and 2B are diagrammatic, cross-sectional views, at right angles to the thickness direction, of the device 10 of FIG. 1 in successive stages of the manufacturing process carried out by means of a method in accordance with the invention. The semiconductor element 1 is obtained in a customary manner using common semiconductor technology which is applied to, for example, a silicon substrate which is divided into individual elements 1, for example by sawing, after the semiconductor element has been made suitable for final assembly. At the lower side, such an element 1 is provided with the above-mentioned conductive layer 3 to which a layer 4 of a conductive silver-containing organic matrix 4 is applied, in this case an adhesive layer 4 containing silver flakes in an epoxy matrix, which adhesive layer forms a solid foil 4 at room temperature.

The element 1 is held at the upper side by means of a vacuum pipette 21. The element 1 is placed above a conductive plate 2, in this case a lead frame 2 of copper. The plate 2 is heated to a temperature of at least 350° C., preferably approximately 400° C., by means of a heating device 20. Subsequently, the pipette 21 is used to press the element 1 down on the plate 2 in a direction indicated by means of reference numeral 30. In this case, the amount of pressure exerted is comparatively large, namely in the range from 50 to 70 gramf, in the case of, for example, a semiconductor element 1 having dimensions of 350×350 $\mu m^2$. Next, the silver-containing organic matrix 4 is compressed and cured, and is electroconductively connected to, on the one hand, the element 1 and, on the other hand, the copper of the plate 2. All this takes place in a period of time that is chosen to range between 5 and 50 msec, preferably approximately 20 msec. Subsequently, (see FIG. 2B) one or more wire connections 5 are made, for example by means of thermocompression or ultrasonically, between the upper side of the element 1 and of conductors 2A forming part of the plate 2. The wires 5 may consist of aluminum or copper or of gold or palladium. The element 1, the wire connections 5 and parts of the lead frame 2 are subsequently provided with a protective synthetic resin envelope 6, after which the device 10 shown in FIG. 1 is obtained.

Surprisingly it has been found that, by virtue of the method in accordance with the invention, the adhesion of the compound 4 between the element 1 and the plate 2 is so strong that, even if the element 1 has comparatively small dimensions of maximally approximately 400 $\mu m$, the element 1 no longer becomes detached from the plate 2 during the formation of the wire connections 5. On the other hand, it has been found that the compound 4 thus formed still is sufficiently flexible to deal with a difference in thermal expansion between the element 1 and the plate 2, particularly if the latter is made of copper. In this manner, devices 10 are obtained having favorable properties, such as a high reliability and a high yield. The best results are obtained if the thermal treatment is carried at approximately 400° C. during attaching the element 1 to the plate 2. The connection formed at said temperature proves to be even approximately twice as strong as that formed at 350° C., while the properties such as electric conductivity and flexibility are still excellent.

The invention is not limited to the example described hereinabove, and within the scope of the invention many modifications and variations are possible to those skilled in the art. For example, thicknesses and materials other than those employed in the example may be used. The invention is particularly suitable for (semi-)discrete semiconductor devices, such as diodes and transistors, but it may also advantageously be used in the manufacture of, in particular, comparatively small ICs.

It is further noted that, apart from an AuGe (or AuSb) layer that is applied to the semiconductor element, use can also be made of AuGe (AuSb) which is added to the silver-containing organic matrix. It is further noted that positioning the semiconductor element (on the plate), pressing it down (on the plate), and curing the silver-containing organic matrix cannot only be carried out in a single, combined process step but also in a plurality of individual process steps. Finally, it is noted that the silver-containing organic matrix cannot only be used in the form of a solid foil, but also as a paste. This paste can be applied to the semiconductor element by means of a dispensing technique. The organic matrix may alternatively be formed by using organic materials other than epoxy materials.

What is claimed is:

1. A method of manufacturing a semiconductor device comprising a semiconductor element that is situated on an electroconductive plate, wherein a side of the semiconductor element adjoining the electroconductive plate borders on an electroconductive eutectic layer containing a Au (gold) mixture, and subsequently the semiconductor element is attached to the electroconductive plate by means of an Ag (silver)—containing an organic matrix which is cured by means of a thermal treatment, characterized in that said thermal treatment takes place at a temperature of at least 350° C. so that a portion of the eutectic mixture penetrates into the Ag organic matrix.

2. A method as claimed in claim 1, characterized in that the thermal treatment takes place at a temperature of approximately 400° C.

3. A method as claimed in claim 1, characterized in that the Ag-containing organic matrix is provided on the semiconductor element, wherein the eutectic layer comprises a mixture of Au and Ge, on the side of a conductive layer containing the Au—Ge of eutectic composition, after which the semiconductor element is pressed down on the electroconductive plate which has been heated to the temperature required for the thermal treatment.

4. A method as claimed in claim 1, characterized in that copper is used as the material for the electroconductive plate.

5. A method as claimed in claim 1, characterized in that the semiconductor element is attached directly onto the conductive plate by means of the silver-containing organic matrix.

6. A method as claimed in claim 1, characterized in that for the silver-containing organic matrix use is made of an epoxy-based multi-component mixture.

7. A method as claimed in claim 1, characterized in that the duration of the thermal treatment ranges between 5 and 50 msec.

8. A method as claimed in claim 1, characterized in that the electroconductive plate is formed as an assembly of electric conductors, and the semiconductor element, after it has been attached to the electroconductive plate, is provided with one or more wire connections connecting it to one or more conductors that form part of the plate.

9. A method as claimed in claim 1, characterized in that the dimensions of the semiconductor element are chosen to be smaller than or equal to approximately 500 $\mu$m.

10. A semiconductor device which is obtained by means of a method as claimed in claim 1.

11. A method as claimed in claim 1, characterized in that the duration of the thermal treatment is approximately 20 msec.

12. A method as claimed in claim 1, characterized in that the gold mixture comprises gold and antimony.

* * * * *